(12) United States Patent
Tseng et al.

(10) Patent No.: US 10,103,691 B2
(45) Date of Patent: Oct. 16, 2018

(54) POWER AMPLIFIER SYSTEM AND ASSOCIATED BIAS CIRCUIT

(71) Applicant: MEDIATEK INC., Hsin-Chu (TW)

(72) Inventors: Chien-Wei Tseng, Keelung (TW); Ming-Da Tsai, Miaoli (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/361,468

(22) Filed: Nov. 27, 2016

(65) Prior Publication Data

US 2017/0214369 A1    Jul. 27, 2017

Related U.S. Application Data

(60) Provisional application No. 62/287,448, filed on Jan. 27, 2016.

(51) Int. Cl.
| | |
|---|---|
| *H03F 3/45* | (2006.01) |
| *H03F 1/26* | (2006.01) |
| *H03F 3/21* | (2006.01) |
| *H03F 3/193* | (2006.01) |
| *H03F 1/02* | (2006.01) |

(Continued)

(52) U.S. Cl.
CPC ............ *H03F 1/26* (2013.01); *H03F 1/0261* (2013.01); *H03F 1/301* (2013.01); *H03F 3/193* (2013.01); *H03F 3/195* (2013.01); *H03F 3/21* (2013.01); *H03F 3/245* (2013.01); *H03F 3/45179* (2013.01); *H03F 3/45071* (2013.01); *H03F 3/45085* (2013.01); *H03F 3/45183* (2013.01); *H03F 2200/219* (2013.01); *H03F 2200/225* (2013.01); *H03F 2203/45144* (2013.01); *H03F 2203/45154* (2013.01);

(Continued)

(58) Field of Classification Search
CPC .......... H03F 1/26; H03F 3/45179; H03F 3/21; H03F 3/193; H03F 2203/45154; H03F 2203/45144; H03F 2203/45172; H03F 2200/225; H03F 1/0261; H03F 1/301; H03F 3/195; H03F 3/245
USPC ......................................... 330/188, 261, 296
See application file for complete search history.

(56) References Cited

U.S. PATENT DOCUMENTS 5,068,621 A * 11/1991 Hayward .............. H03F 1/3211
                                                        330/261
6,300,837 B1    10/2001 Sowlati et al.
(Continued)

FOREIGN PATENT DOCUMENTS

| EP | 2 184 850 A1 | 5/2010 |
|---|---|---|
| JP | 2009165100 A | 7/2009 |
| WO | 2008004034 A1 | 1/2008 |

OTHER PUBLICATIONS

Shengjie Gao et al., Concurrent Dual-Band Power Amplifier with Second Harmonic Controlled by Gate and Drain Bias Circuit, 2011, pp. 309-312, XP031950822, IEEE.

(Continued)

*Primary Examiner* — Khanh V Nguyen
(74) *Attorney, Agent, or Firm* — Winston Hsu

(57) ABSTRACT

A power amplifier system includes a differential power amplifier and a bias circuit. The differential power amplifier is arranged for receiving a differential input pair to generate an output signal. The bias circuit is arranged for generating a bias voltage to bias the differential power amplifier, and the bias circuit comprises a source follower for receiving a reference voltage to generate the bias voltage.

21 Claims, 4 Drawing Sheets

(51) Int. Cl.
*H03F 1/30* (2006.01)
*H03F 3/195* (2006.01)
*H03F 3/24* (2006.01)

(52) U.S. Cl.
CPC .............. *H03F 2203/45172* (2013.01); *H03F 2203/45542* (2013.01); *H03F 2203/45621* (2013.01); *H03F 2203/50* (2013.01)

(56) References Cited

U.S. PATENT DOCUMENTS

| | | | |
|---|---|---|---|
| 6,313,705 B1 | 11/2001 | Dening et al. | |
| 6,333,677 B1 | 12/2001 | Dening | |
| 6,717,463 B2 | 4/2004 | Aparin et al. | |
| 6,803,822 B2 | 10/2004 | Kim et al. | |
| 6,882,227 B2 | 4/2005 | Barry et al. | |
| 6,956,437 B2 * | 10/2005 | Lopez | G05F 3/205 330/296 |
| 7,242,252 B2 * | 7/2007 | Taylor | G05F 3/205 330/296 |
| 7,304,540 B2 | 12/2007 | Tu | |
| 7,358,817 B2 | 4/2008 | Kao et al. | |
| 7,944,303 B2 | 5/2011 | Cozzolino | |
| 8,258,876 B1 * | 9/2012 | Osika | H03F 1/34 330/279 |
| 8,525,590 B2 * | 9/2013 | Joly | H03F 1/0211 330/285 |
| 9,041,466 B2 * | 5/2015 | Ortiz | H03F 3/45076 330/261 |
| 9,166,533 B2 | 10/2015 | Marra et al. | |
| 9,417,641 B2 * | 8/2016 | Signoff | G05F 1/46 |
| 2004/0124921 A1 * | 7/2004 | Burt | H03F 3/45192 330/255 |
| 2010/0156536 A1 | 6/2010 | Lee | |
| 2014/0035673 A1 | 2/2014 | Ortiz | |

OTHER PUBLICATIONS

Koichi Kimura et al., Improvement in ACLR Asymmetry for W-CDMA InGaP/GaAs HBT Power Amplifier, 2004, pp. 333-336, XP031996222, 34th European Microwave Conference, Amsterdam.

* cited by examiner

US 10,103,691 B2

POWER AMPLIFIER SYSTEM AND ASSOCIATED BIAS CIRCUIT

CROSS REFERENCE TO RELATED APPLICATIONS

This application claims the priority of U.S. Provisional Application No. 62/287,448, filed on Jan. $27^{th}$, 2016, which is included herein by reference in its entirety.

BACKGROUND

As a wireless communication system becomes more complicated, a linearity of a power amplifier is more critical. The nonlinearity of the power amplifier will affect a total chain adjacent channel leakage ratio (ACLR) of a transmitter, and the $3^{rd}$ order inter-modulation of the power amplifier is a root cause of the ACLR performance. Therefore, how to effectively lower the $3^{rd}$ order inter-modulation to increase the linearity of the power amplifier and improve the ACLR performance is an important topic.

SUMMARY

It is therefore an objective of the present invention to provide a bias circuit for providing a bias voltage to bias the power amplifier, which has lower output impedance and is capable of rejecting a power amplifier kick-back harmonic interference to stable the bias voltage, to solve the above-mentioned problem.

According to one embodiment of the present invention, a power amplifier system comprises a differential power amplifier and a bias circuit. The differential power amplifier is arranged for receiving a differential input pair to generate an output signal. The bias circuit is arranged for generating a bias voltage to bias the differential power amplifier, and the bias circuit comprises a source follower for receiving a reference voltage to generate the bias voltage.

According to another embodiment of the present invention, a power amplifier system comprises a power amplifier and a bias circuit. The power amplifier is arranged for receiving an input signal to generate an output signal. The bias circuit is arranged for generating a bias voltage an input node of the power amplifier, and the bias circuit comprises a source follower for receiving a reference voltage to generate the bias voltage to the node of the power amplifier. In addition, there is no physical resistor positioned between the output node of the source follower and the input node of the power amplifier.

According to another embodiment of the present invention, a bias circuit for biasing a differential power amplifier is provided, wherein the differential power amplifier receives the differential input pair from a transformer, and the bias circuit comprises: a source follower, for receiving a reference voltage to generate a bias voltage to a center tap of the transformer to bias the differential power amplifier.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
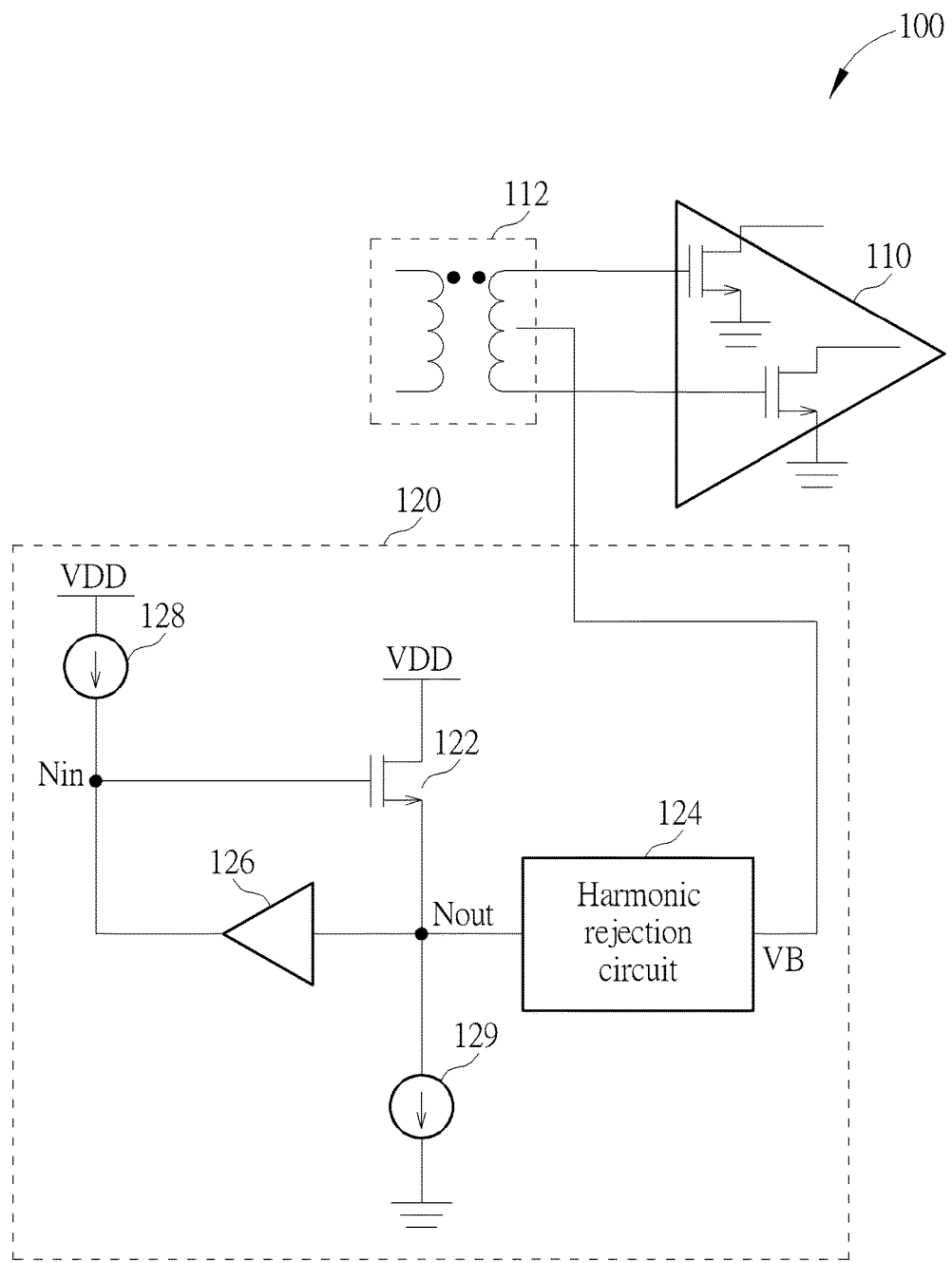
FIG. 1 is a diagram illustrating a power amplifier system according to one embodiment of the present invention.

Please refer to FIG. 1, which is a diagram illustrating a power amplifier system 100 according to one embodiment of the present invention. As shown in FIG. 1, the power amplifier system 100 comprises a differential power amplifier 110, a transformer 112 and a bias circuit 120, where the bias circuit 120 comprises a source follower 122, a harmonic rejection circuit 124, a feedback amplifier 126 and two current sources 128 and 129. In this embodiment, the power amplifier system 100 is a radio frequency (RF) power amplifier system.

In the operations of the power amplifier system 100, the differential power amplifier 110 receives a differential input pair from the transformer 112 to generate an output signal, and the bias circuit 120 provides a stable bias voltage VB to a center tap of a secondary winding of the transformer 112 to bias the differential power amplifier 110 . In addition, in the operations of the bias circuit 120, the source follower 122 receives a reference voltage at an input node Nin to generate the bias voltage VB at the output node Nout, the feedback amplifier 126 receives the bias voltage VB to provide the reference voltage, and the harmonic rejection circuit 124 is arranged to reject power amplifier kick-back harmonics, especially to reject $2^{nd}$ kick-back harmonics, to stable the generation of the bias voltage VB.

In the embodiment shown in FIG. 1, the bias voltage VB is connected to the center tap of the secondary winding of the transformer 112. In other embodiments of the present invention, however, as long as the transistors within the differential power amplifier 110 are biased by a voltage from the bias voltage VB, the bias voltage VB provided by the bias circuit 120 can connect to any suitable terminal of the power amplifier system 100.

Because the source follower 122 has low output impedance and the power amplifier kick-back harmonics are rejected, the $3^{rd}$ order inter-modulations are more symmetrical and the ACLR performance is better, and the bias voltage VB is more stable. In this embodiment, the output impedance of the source follower is close to $$"\frac{1}{g_{m1}+g_{mb1}}\left(\frac{1}{g_{m2}*r_{o1}}\right)",$$

where "gm1" is a transconductance of the source follower 122, "gmb1" is a body transconductance of the source follower 122, "gm2" is a transconductance of the feedback amplifier 126, and "ro1" is a finite resistance in a small signal model.

Figure 2:
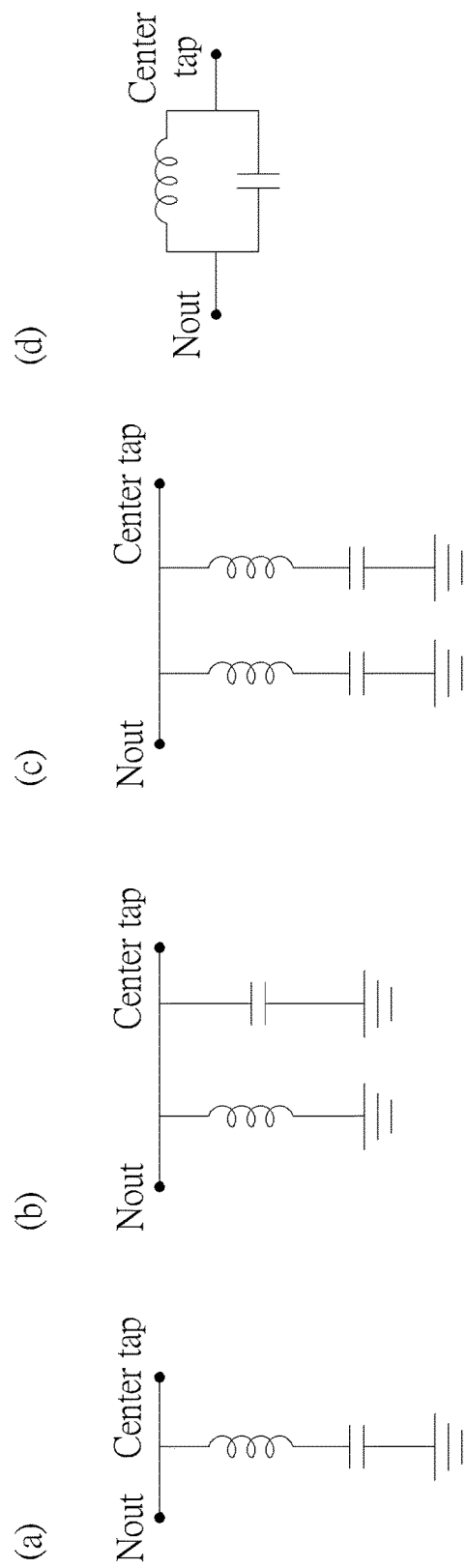
FIG. 2 shows several embodiments of the harmonic rejection circuit.

The harmonic rejection circuit 124 can be arranged to reject the power amplifier $2^{nd}$ kick-back harmonic only, or to reject more kick-back harmonics (e.g. $2^{nd}$, $3^{rd}$, $4^{th}$ kick-back harmonics ... ). For example, the harmonic rejection circuit 124 can be implemented by at least an inductor and at least a capacitor such as a shunt inductor-capacitor (LC) trap or a series LC trap. FIG. 2 shows several embodiments of the harmonic rejection circuit 124, where FIG. 2(a) shows that the harmonic rejection circuit 124 is implemented by a capacitor and an inductor connected in series between the output node Nout and a ground voltage; FIG. 2 (b) shows that the harmonic rejection circuit 124 is implemented by a capacitor and an inductor connected in parallel between the output node Nout and the ground voltage; FIG. 2(c) shows that the harmonic rejection circuit 124 is implemented by two groups of capacitor and inductor connected in series between the output node Nout and the ground voltage; and FIG. 2(d) shows that the harmonic rejection circuit 124 is implemented by a capacitor and an inductor connected in parallel between the output node Nout and the center tap of the transformer 112.

In addition, to make the $3^{rd}$ order inter-modulations more symmetrical to improve the ACLR performance, no physical resistor is intentionally positioned between the output node Nout of the source follower 122 and the center tap of the transformer 112.

Figure 3:
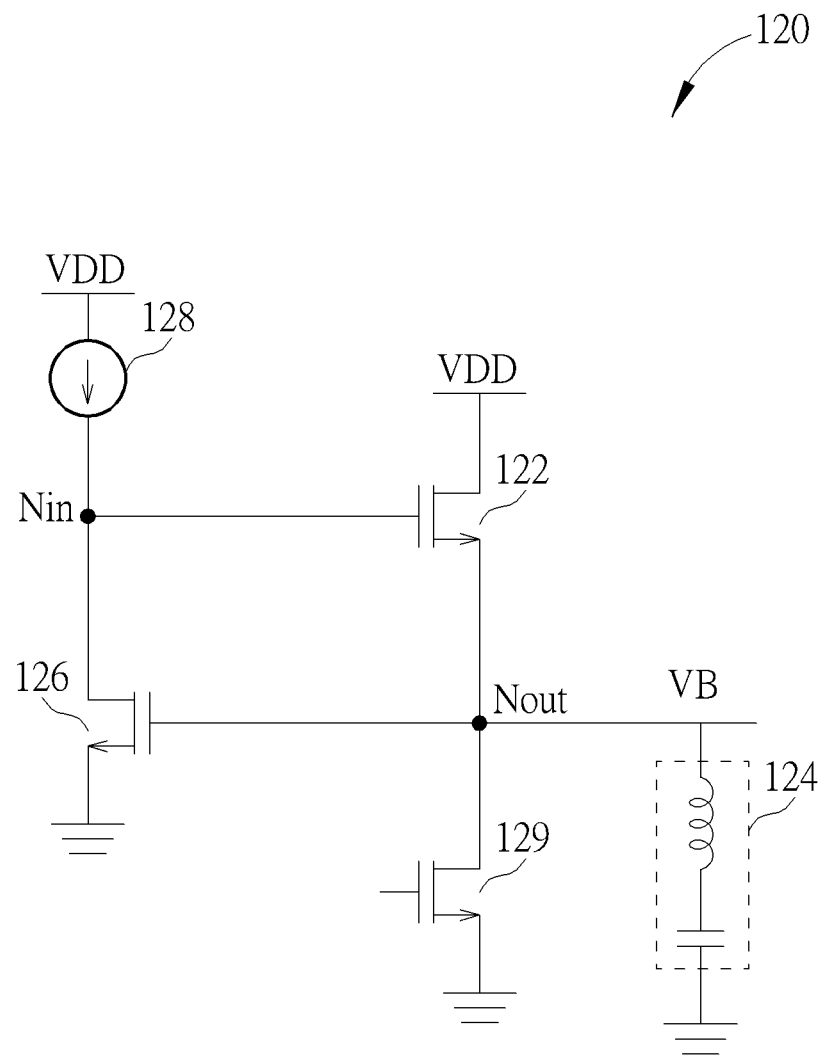
FIG. 3 shows the bias circuit according to one embodiment of the present invention.

FIG. 3 shows the bias circuit 120 according to one embodiment of the present invention. In FIG. 3, the feedback amplifier 126 is implemented by an NMOS, the current source 129 is implemented by an NMOS, and the harmonic rejection circuit 124 is implemented by the LC trap.

Figure 4:
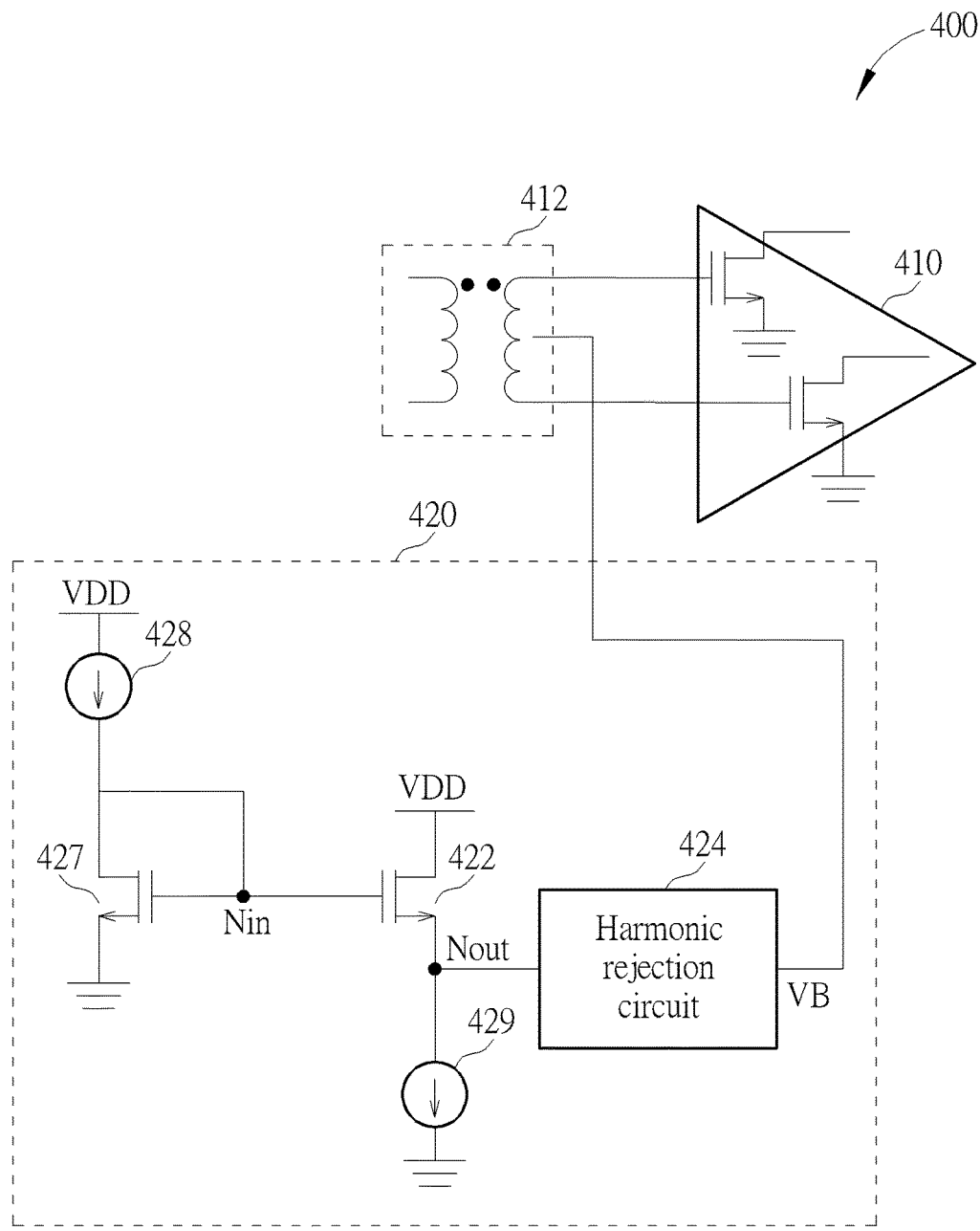
FIG. 4 is a diagram illustrating a power amplifier system according to one embodiment of the present invention.

Please refer to FIG. 4, which is a diagram illustrating a power amplifier system 400 according to one embodiment of the present invention. As shown in FIG. 4, the power amplifier system 400 comprises a differential power amplifier 410, a transformer 412 and a bias circuit 420, where the bias circuit 420 comprises a source follower 422, a harmonic rejection circuit 424, an NMOS 427 and two current sources 428 and 429.

In the operations of the power amplifier system 400, the differential power amplifier 410 receives a differential input pair from the transformer 412 to generate an output signal, and the bias circuit 420 provides a stable bias voltage VB to a center tap of a secondary winding of the transformer 412 to bias the differential power amplifier 410. In addition, in the operations of the bias circuit 420, the source follower 422 receives a reference voltage at an input node Nin to generate the bias voltage VB at the output node Nout, wherein the input node Nin is also a gate electrode and a drain electrode of the NMOS 427; and the harmonic rejection circuit 424 is arranged to reject power amplifier kick-back harmonics, especially to reject $2^{nd}$ kick-back harmonics, to stable the generation of the bias voltage VB.

In the embodiment shown in FIG. 4, the bias voltage VB is connected to the center tap of the secondary winding of the transformer 412. In other embodiments of the present invention, however, as long as the transistors within the differential power amplifier 410 are biased by a voltage from the bias voltage VB, the bias voltage VB provided by the bias circuit 420 can connect to any suitable terminal of the power amplifier system 400.

Because the source follower 422 has low output impedance and the power amplifier kick-back harmonics are rejected, the $3^{rd}$ order inter-modulations are more symmetrical and the ACLR performance is better, and the bias voltage VB is more stable. In this embodiment, the output impedance of the source follower is close to $$"\frac{1}{g_{m1}+g_{mb1}}",$$

where "gm1" is a transconductance of the source follower 422, "gmb1" is a body transconductance of the source follower 422.

The harmonic rejection circuit 424 can be arranged to reject the power amplifier $2^{nd}$ kick-back harmonic only, or to reject more kick-back harmonics (e.g. $2^{nd}$, $3^{rd}$, $4^{th}$ kick-back harmonics ... ). In this embodiment, the harmonic rejection circuit 124 can be implemented by at least an inductor and at least a capacitor such as one of the embodiments shown in FIG. 2.

In addition, to make the $3^{rd}$ order inter-modulations more symmetrical to improve the ACLR performance, no physical resistor is intentionally positioned between the output node Nout of the source follower 422 and the center tap of the transformer 412.

Briefly summarized, in the power amplifier system of the present invention, the bias circuit is arranged to have lower output impedance and is capable of rejecting a power amplifier kick-back harmonic interference to stable the bias voltage. Hence, the $3^{rd}$ order inter-modulation is more symmetrical and the ACLR performance can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power amplifier system, comprising:
   a differential power amplifier, for receiving a differential input pair to generate an output signal;
   a bias circuit, for generating a bias voltage to bias the differential power amplifier, wherein the bias circuit comprises:
   a source follower, for receiving a reference voltage to generate the bias voltage; and
   a harmonic rejection circuit, positioned between an output node of the source follower and an input node of the differential power amplifier, for rejecting power amplifier kick-back harmonic(s), wherein the harmonic rejection circuit is implemented by at least a shunt inductor-capacitor (LC) trap or a series LC trap.

2. The power amplifier system of claim 1, wherein the differential power amplifier receives the differential input pair from a transformer, and the source follower receives the reference voltage to generate bias voltage to a center tap of the transformer to bias the differential power amplifier.

3. The power amplifier system of claim 2, wherein the harmonic rejection circuit is positioned between the output node of the source follower and the center tap of the transformer, for rejecting the power amplifier kick-back harmonic(s).

4. The power amplifier system of claim 3, wherein the harmonic rejection circuit does not comprise any physical resistor.

5. The power amplifier system of claim 2, wherein there is no physical resistor positioned between the output node of the source follower and the center tap of the transformer.

6. The power amplifier system of claim 1, wherein the bias circuit comprises:
   a feedback amplifier, wherein an input node of the feedback amplifier is connected to the output node of the source follower, and an output node of the feedback amplifier is connected to an input node of the source follower.

7. A power amplifier system, comprising:
   a power amplifier, for receiving an input signal to generate an output signal;
   a bias circuit, for generating a bias voltage to an input node of the power amplifier, wherein the bias circuit comprises:
      a source follower, for receiving a reference voltage to generate the bias voltage to the input node of the power amplifier; and
      a harmonic rejection circuit, positioned between the output node of the source follower and the input node of the power amplifier, for rejecting power amplifier kick-back harmonic(s), wherein the harmonic rejection circuit is implemented by at least a shunt inductor-capacitor (LC) trap or a series LC trap;
      wherein there is no physical resistor positioned between an output node of the source follower and the input node of the power amplifier.

8. The power amplifier system of claim 7, wherein the bias circuit comprises:
   a feedback amplifier, wherein an input node of the feedback amplifier is connected to the output node of the source follower, and an output node of the feedback amplifier is connected to an input node of the source follower.

9. A bias circuit for biasing a differential power amplifier, wherein the differential power amplifier receives the differential input pair from a transformer, and the bias circuit comprises:
   a source follower, for receiving a reference voltage to generate a bias voltage to bias an input terminal of the differential power amplifier; and
   a harmonic rejection circuit, positioned between an output node of the source follower and the input node of the differential power amplifier, for rejecting power amplifier kick-back harmonic(s), wherein the harmonic rejection circuit is implemented by at least a shunt inductor-capacitor (LC) trap or a series LC trap.

10. The bias circuit of claim 9, wherein the source follower generates the bias voltage to a center tap of the transformer to bias the input terminal of the differential power amplifier, and the harmonic rejection circuit is positioned between an output node of the source follower and an center tap of an transformer, for rejecting power amplifier kick-back harmonic(s).

11. The bias circuit of claim 9, wherein the harmonic rejection circuit does not comprise any physical resistor.

12. The bias circuit of claim 9, wherein the source follower generates the bias voltage to a center tap of the transformer to bias the input terminal of the differential power amplifier, and there is no physical resistor positioned between the output node of the source follower and the center tap of the transformer.

13. The bias circuit of claim 9, further comprising:
   a feedback amplifier, wherein an input node of the feedback amplifier is connected to the output node of the source follower, and an output node of the feedback amplifier is connected to an input node of the source follower.

14. A power amplifier system, comprising:
   a differential power amplifier, for receiving a differential input pair to generate an output signal;
   a bias circuit, for generating a bias voltage to bias the differential power amplifier, wherein the bias circuit comprises:
      a source follower, for receiving a reference voltage to generate the bias voltage; and
      a feedback amplifier, wherein an input node of the feedback amplifier is connected to the output node of the source follower, and an output node of the feedback amplifier is connected to an input node of the source follower.

15. The power amplifier system of claim 14, wherein the differential power amplifier receives the differential input pair from a transformer, and the source follower receives the reference voltage to generate bias voltage to a center tap of the transformer to bias the differential power amplifier.

16. The power amplifier system of claim 15, wherein the bias circuit further comprises:
   a harmonic rejection circuit, positioned between an output node of the source follower and the center tap of the transformer, for rejecting power amplifier kick-back harmonic(s).

17. The power amplifier system of claim 16, wherein the harmonic rejection circuit is implemented by at least an inductor and at least a capacitor.

18. A bias circuit for biasing a differential power amplifier, wherein the differential power amplifier receives the differential input pair from a transformer, and the bias circuit comprises:
   a source follower, for receiving a reference voltage to generate a bias voltage to a center tap of the transformer to bias the differential power amplifier; and
   a feedback amplifier, wherein an input node of the feedback amplifier is connected to the output node of the source follower, and an output node of the feedback amplifier is connected to an input node of the source follower.

19. The bias circuit of claim 18, wherein the bias circuit further comprises:
   a harmonic rejection circuit, positioned between an output node of the source follower and the center tap of the transformer, for rejecting power amplifier kick-back harmonic(s).

20. The bias circuit of claim 19, wherein the harmonic rejection circuit is implemented by at least a shunt inductor-capacitor (LC) trap or a series LC trap.

21. The bias circuit of claim 19, wherein the harmonic rejection circuit does not comprise any physical resistor.

* * * * *